(12) United States Patent
Tomiyama et al.

(10) Patent No.: US 8,104,154 B2
(45) Date of Patent: Jan. 31, 2012

(54) METHOD OF MANUFACTURING A PIEZOELECTRIC VIBRATING PIECE

(75) Inventors: Mitsuo Tomiyama, Chiba (JP); Takashi Kobayashi, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 515 days.

(21) Appl. No.: 12/357,148

(22) Filed: Jan. 21, 2009

(65) Prior Publication Data

US 2009/0205177 A1    Aug. 20, 2009

(30) Foreign Application Priority Data

Feb. 15, 2008    (JP) .............................. JP2008-035049

(51) Int. Cl.
*H04R 17/10* (2006.01)
*B23P 19/10* (2006.01)

(52) U.S. Cl. .............. 29/25.35; 29/846; 29/417; 29/760; 438/735; 156/345.51; 331/156; 310/312; 310/365; 310/367

(58) Field of Classification Search .................. 29/25.35, 29/846, 831, 412, 417, 760; 438/735, 737; 156/345.51; 331/156, 158; 333/150; 310/312, 310/348, 365, 367, 370

See application file for complete search history.

(56) References Cited

U.S. PATENT DOCUMENTS

2007/0176702 A1 *    8/2007    Takizawa et al. ............. 331/158

FOREIGN PATENT DOCUMENTS

| JP | 58-13009 | * | 1/1983 | .................... 333/150 |
| JP | 2006-148758 | | 6/2006 | |
| JP | 2007-142795 | * | 6/2007 | |

* cited by examiner

*Primary Examiner* — A. Dexter Tugbang
(74) *Attorney, Agent, or Firm* — Brinks Hofer Gilson & Lione

(57) ABSTRACT

To efficiently fabricate a high quality piezoelectric vibrating piece regardless of an accuracy of an outer shape of a wafer, there is provided a method of fabricating a plurality of piezoelectric vibrating pieces at a time utilizing a wafer S, the method including a step of forming two or more of through holes 40 and forming outer shapes of a plurality of piezoelectric plates 10 simultaneously with the through holes by constituting reference points G by centers of the through holes by etching the wafer by a photolithography technology, a step of preparing a jig for a wafer having inserting pins formed to project by a number the same as a number of the through holes from above a flat plate portion, thereafter, mounting the wafer on the flat plate portion in a state of inserting the inserting pin into the through hole, a step of forming an electrode on outer surfaces of the plurality of piezoelectric plates, and a step of cutting to separate the plurality of piezoelectric plates from the wafer to fragment, and in the electrode forming step and the cutting step, positioning to the wafer is carried out by constituting the reference point by the center of the through hole.

3 Claims, 13 Drawing Sheets

METHOD OF MANUFACTURING A PIEZOELECTRIC VIBRATING PIECE

RELATED APPLICATIONS

This application claims priority under 35 U.S.C. §119 to Japanese Patent Application No. JP2008-035049 filed on Feb. 15, 2008, the entire content of which is hereby incorporated by reference.

BACKGROUND OF THE INVENTION

1. Field of the Invention

The present invention relates to a fabricating method of fabricating a piezoelectric vibrating piece constituted by a piezoelectric material of quartz, lithium tantalate or the like, a piezoelectric vibrating piece fabricated by the fabricating method, a piezoelectric vibrator having the piezoelectric vibrating piece, an oscillator, an electronic apparatus and a radiowave timepiece having the piezoelectric vibrator.

Further, the invention relates to a wafer used in fabricating a piezoelectric vibrating piece and a jig for a wafer for holding the wafer.

2. Description of the Related Art

In recent years, a portable telephone or a portable information terminal apparatus uses a piezoelectric vibrator utilizing quartz or the like as a time source, a timing source of a control signal or the like or a reference signal source or the like. Various piezoelectric vibrators of this kind are known, for example, a piezoelectric vibrator having a piezoelectric vibrating piece of a tuning fork type, a piezoelectric vibrator having a piezoelectric vibrating piece of carrying out a thickness slipping vibration or the like is known.

Meanwhile, the piezoelectric vibrating piece is formed by a wafer (semiconductor wafer) made of various piezoelectric materials of quartz, lithium tantalate, lithium niobate and the like. Specifically, a wafer is polished to a predetermined thickness, thereafter, a plurality of outer shapes of piezoelectric vibrating pieces are formed by etching by a photolithography technology, and electrodes are formed by patterning respectively predetermined metal films to the plurality of piezoelectric vibrating pieces the outer shapes of which are formed. Thereby, a plurality of piezoelectric vibrating pieces can be formed from one piece of a wafer at a time.

Meanwhile, in fabricating a piezoelectric vibrating piece, it is general that first, the outer shape is formed, thereafter, patterning of a metal film or the like is carried out as described above (refer to JP-A-2006-148758). At this occasion, in order to fabricate a high quality piezoelectric vibrating piece, it is necessary to pattern metal films or the like accurately respectively to outer surfaces of the plurality of piezoelectric vibrating pieces outer shapes of which are formed. Therefore, it is requested to accurately position a wafer to a mask or the like. In this respect, in a background art, in working a wafer, it is a current state that a reference is constituted by an outer shape of the wafer.

However, the following problem remains yet.

First, in order to fabricate a piezoelectric vibrating piece by working a wafer, it is necessary that masks formed with various patterns are properly used in accordance with steps, and the masks are accurately positioned to the wafer at the respective times. For example, there are a case of patterning an electrode for vibrating a piezoelectric vibrating piece, a case of patterning a weight metal film 28 in order to adjust a frequency of a piezoelectric vibrating piece, a case of finally cutting respective piezoelectric vibrating pieces from a wafer and the like.

Meanwhile, in a background art, when a mask is positioned to a wafer, the mask is set by constituting a reference by the outer shape of the wafer as described above. Therefore, a quality of the piezoelectric vibrating piece is controlled by an accuracy of an outer shape of the wafer.

That is, although after forming a plurality of outer shapes of piezoelectric vibrating pieces at a wafer, it is necessary to accurately pattern respective electrodes, weight metal films 28 and the like, all of the outer shapes of wafers are not uniform but a more or less difference is necessarily brought about by the wafers. Therefore, when the mask is positioned to the wafer finished with forming the outer shape of the piezoelectric vibrating piece, a pattern of the mask does not coincide with the respective piezoelectric vibrating pieces and more or less deviation are frequently brought about.

Therefore, it is necessary to position the mask in consideration of the deviation, and therefore, time and labor is taken in positioning and an efficient operation cannot be carried out. Further, even in consideration of the deviation, high accuracy positioning is still difficult, and it is difficult to fabricate a high quality piezoelectric vibrating piece.

SUMMARY OF THE INVENTION

The invention has been carried out in consideration of such a situation and it is a principal object thereof to provide a method of fabricating a piezoelectric vibrating piece capable of efficiently fabricating a high quality piezoelectric vibrating piece regardless of an accuracy of an outer shape of a wafer, and a piezoelectric vibrating piece fabricated by the fabricating method.

Further, it is other object thereof to provide a piezoelectric vibrator having the piezoelectric vibrating piece, and an oscillator, an electronic apparatus and a radiowave timepiece having the piezoelectric vibrator.

Further, it is still other object of the invention to provide a wafer used for fabricating the piezoelectric vibrating piece, and a jig for a wafer for holding the wafer.

The invention provides the following means in order to resolve the above-described problem.

A method of fabricating a piezoelectric vibrating piece according to the invention is a method of fabricating a plurality of piezoelectric vibrating pieces each including a piezoelectric plate made of a piezoelectric material, and an electrode formed on an outer surface of the piezoelectric plate for vibrating the piezoelectric plate when a predetermined voltage is applied thereto at a time using a wafer, the method comprising an outer shape forming step of forming two or more of through holes penetrating the wafer and forming outer shapes of the plurality of piezoelectric plates at the wafer by constituting reference points by centers of the through holes by etching the wafer by a photolithography technology, a wafer setting step of preparing a jig for the wafer having a flat plate portion and inserting pins formed by a number the same as a number of the through holes to project from above the flat plate portion, thereafter, mounting the wafer on the flat plate portion in a state of inserting the inserting pins into the through holes, an electrode forming step of forming an electrode by patterning the electrode film on the outer surfaces of the plurality of piezoelectric plates, and a cutting step of cutting to separate the plurality of piezoelectric plates on the wafer to fragment, wherein in the electrode forming step and the cutting step, positioning to the wafer is carried out by constituting a reference point by a center of the through hole.

In the method of fabricating a piezoelectric vibrating piece according to the invention, first, there is carried out the outer shape forming step of forming at least two or more of the through holes penetrating the wafer and forming the outer shapes of the plurality of piezoelectric plates simultaneously with forming the through holes by etching the wafer made of the piezoelectric material of quartz or the like by the photolithography technology. At this occasion, the outer shape of the piezoelectric plate is formed by constituting the reference point by the center of the through hole. Thereby, positions of all of the piezoelectric plates the outer shapes of which are formed can accurately be specified by the reference points.

Successively, the wafer is mounted on the flat plate portion of the jig for the wafer while inserting the inserting pin into the through hole. Thereby, the wafer is stably held by the jig for the wafer without rattling. Further, there is brought about the state of inserting the inserting pin into the through hole, and therefore, the center of the inserting pin can be replaced by the reference point and the reference point is made to be easy to grasp.

Successively, there is carried out the electrode forming step of forming the electrode by patterning the electrode film on the outer surfaces of the plurality of piezoelectric plates. Further, there is carried out the cutting step of cutting to separate the plurality of piezoelectric plates from the wafer to fragment after forming the electrode. Thereby, the plurality of piezoelectric vibrating pieces formed with the electrodes for vibrating the piezoelectric plates on the outer surfaces of the piezoelectric plates can be fabricated at a time from the single wafer.

Particularly, although in the electrode forming step and the cutting step, exposing and developing needs to be carried out pertinently by utilizing the mask previously formed with the pattern, positioning of the mask can be carried out by constituting the reference point by the center of the through hole. Therefore, different from the case of the background art of constituting the reference by the outer shape of the wafer, the mask can highly accurately be positioned to the plurality of piezoelectric plates without being influenced by accuracy of the outer shape of the wafer. Further, two or more of the through holes are formed, and therefore, two or more of the reference points can be ensured, and positioning can be carried out without being influenced by the direction of the wafer. Therefore, there is not a concern of bringing about a positional shift by being caused by the accuracy of the outer shape of the wafer. Therefore, the high quality piezoelectric vibrating piece can be fabricated.

Further, the wafer can stably be held by the jig for the wafer, the reference point can firmly be grasped by the inserting pin, and therefore, the positioning operation can easily be carried out. Therefore, a fabrication efficiency can be made to be far higher than that of the background art, which can amount to low cost formation of the piezoelectric vibrating piece.

Further, there is provided the method of fabricating a piezoelectric vibrating piece according to the invention, wherein in the outer shape forming step, the through hole is formed such that a corner portion thereof is constituted by an R shape when the wafer is viewed planely in the above-described method of fabricating a piezoelectric vibrating piece of the invention.

In the method of fabricating the piezoelectric vibrating piece according to the invention, the through hole is formed such that the corner portion intersecting a straight line and a straight line is constituted by the R shape (smooth curve) when the wafer is viewed planely. Thereby, even when an external force is operated to the wafer by way of the through hole in the midst of fabrication, the external force can be prevented from being concentrated on the corner portion.

Therefore, a crack is difficult to be brought about at the wafer by constituting an onset by the corner portion. Therefore, a chip off or a crack can be prevented from being brought about at the wafer. As a result, a fabrication efficiency can further be promoted by improving yield.

Further, there is provided the method of fabricating a piezoelectric vibrating piece according to the inventing, wherein in the outer shape forming step, the through hole is formed to constitute a circular shape when the wafer is viewed planely in the above-described method of fabricating a piezoelectric vibrating piece of the invention.

In the method of fabricating a piezoelectric vibrating piece according to the inventing, the through hole is formed to constitute a circular shape when the wafer is viewed planely. Thereby, even when an external force is operated to the through hole in the midst of fabrication, the external force can be prevented from being concentrated on one point. Therefore, a crack is difficult to be brought about at the wafer. Therefore, a chip off or a crack can be prevented from being brought about at the wafer. As a result, the fabrication efficiency can further be promoted by improving the yield.

Further, there is provided a piezoelectric vibrating piece according to the invention, wherein the piezoelectric vibrating piece is fabricated by the method of fabricating a piezoelectric vibrating piece of the invention.

The piezoelectric vibrating piece according to the invention is fabricated by the above-described fabricating method, and therefore, high quality formation and low cost formation can be achieved.

Further, there is provided a piezoelectric vibrator according to the invention, wherein the piezoelectric vibrator includes the piezoelectric vibrating piece of the invention.

The piezoelectric vibrator according to the invention includes the above-described piezoelectric vibrating piece, and therefore, high quality formation and low cost formation of the piezoelectric vibrator per se can be achieved.

Further, there is provided an oscillator according to the invention, wherein the piezoelectric vibrator of the invention is electrically connected to an integrated circuit as an oscillating piece.

Further, there is provided an electronic apparatus according to the invention, wherein the piezoelectric vibrator of the invention is electrically connected to a time counting portion.

Further, there is provided a radiowave timepiece according to the invention, wherein the piezoelectric vibrator of the invention is electrically connected to a filter portion.

The oscillator, the electronic apparatus and the radiowave timepiece according to the invention include the above-described piezoelectric vibrator, and therefore, high quality formation and low cost formation can similarly be achieved.

Further, there is provided a wafer according to the invention which is a wafer used in fabricating a piezoelectric vibrating piece having a piezoelectric plate made of a piezoelectric material, and an electrode formed on an outer surface of the piezoelectric plate for vibrating the piezoelectric plate when a predetermined voltage is applied thereto, the wafer having two or more of through holes etched by a photolithography technology and penetrating the wafer, and a plurality of the piezoelectric plates outer shapes of which are formed by the etching simultaneously with the through holes by constituting reference points by centers of the through holes, wherein the center of the through hole is utilized as a reference point during a time point until the piezoelectric vibrating piece is fabricated.

When the piezoelectric vibrating piece is fabricated by utilizing the wafer according to the invention, after forming the electrode by patterning the electrode film on the outer surfaces of the plurality of piezoelectric plates the outer shapes of which are formed, the plurality of piezoelectric plates are cut to separate from the wafer to fragment. Thereby, the plurality of piezoelectric vibrating pieces formed with the electrodes of vibrating the piezoelectric plates on the outer surfaces of the piezoelectric plates can be fabricated at a time.

Meanwhile, the wafer includes two or more of the through holes penetrating the wafer and the plurality of piezoelectric plates the outer shapes of which are formed simultaneously with the through holes. Further, the plurality of piezoelectric plates are formed by constituting the reference points by the centers of the through holes. Thereby, all of the piezoelectric plates formed with the outer shapes are brought into a state of accurately specifying the positions by the reference points.

Further, although in forming the electrode or cutting the piezoelectric plate, exposing and developing need to be carried out pertinently by utilizing the mask previously formed with the pattern, positioning of the mask can be carried out by constituting the reference point by the center of the through hole. Therefore, different from the case of the background art constituting the reference by the outer shape of the wafer, the mask can highly accurately be positioned to the plurality of piezoelectric plates without being influenced by the accuracy of the outer shape of the wafer. Further, two or more of the through holes are formed, and therefore two or more of the reference points can be ensured, and positioning can be carried out without being influenced by the direction of the wafer. Therefore, there is not a concern of bringing about a positional shift caused by the accuracy of the outer shape of the wafer. Therefore, the high quality piezoelectric vibrating piece can be fabricated.

Further, the positioning operation can easily be carried out by utilizing the through hole, and therefore, the fabrication efficiency can be made to be far higher than that of the background art, which can amount to low cost formation of the piezoelectric vibrating piece.

Further, there is provided the wafer according to the invention, wherein in the wafer of the invention, the corner portion of the through hole is formed by an R shape when the wafer is viewed planely.

In the wafer according to the invention, the through hole is formed to constitute the corner portion intersecting the straight line and the straight line by the R shape (smooth curve) when the wafer is viewed planely. Thereby, even when an external force is operated to the wafer by way of the through hole in the midst of fabrication, the external force can be prevented from being concentrated on the corner portion. Therefore, a crack is difficult to be brought about at the wafer by constituting an onset by the corner portion. Therefore, a chip off or a crack can be prevented from being brought about at the wafer. As a result, the fabrication efficiency can further be promoted by improving the yield.

Further, there is provided the wafer according to the invention, wherein in the wafer of the invention, the through hole is formed in a circular shape when the wafer is viewed planely.

In the method of fabricating the piezoelectric vibrating piece according to the invention, the through hole is formed to constitute the circular shape when the wafer is viewed planely. Thereby, even when an external force is operated to the wafer by way of the through hole in the midst of fabrication, the external force can be prevented from being concentrated on one point. Therefore, a crack is difficult to be brought about at the wafer. Therefore, a chip off or a crack can be prevented from being brought about at the wafer. As a result, the fabrication efficiency can further be promoted by improving the yield.

Further, the jig for a wafer according to the invention is the jig for a wafer of holding the wafer of the invention, the jig comprising a flat plate portion of mounting the wafer on an upper face thereof, and inserting pins constituted by a size capable of being inserted into the through hole and formed by a number the same as a number of the through holes to project from above the flat plate portion.

The jig for a wafer according to the invention includes the inserting pins formed by a number the same as a number of the through holes to project from above the flat plate portion, and therefore, the wafer can be mounted on the flat plate portion while inserting the inserting pin into the through hole. Thereby, the wafer can stably be held while restraining rattling. Further, there is brought about a state of inserting the inserting pin into the through hole, and therefore, the center of the inserting pin can be replaced by the reference point, and the reference point can be made to be easy to grasp. Therefore, the positioning operation can further easily be carried out and the fabrication efficiency can further be promoted.

Further, there is provided the jig for the wafer according to the invention, wherein in the jig for the wafer of the invention, the inserting pin is formed to converge a front end thereof.

In the jig for the wafer according to the invention, the front end of the inserting pin is converged, and therefore, when the inserting pin is inserted into the through hole, the inserting pin is difficult to be caught or the like. Therefore, a defect or the like is difficult to be attached to the wafer. In addition thereto, further smooth operation can be carried out, which can amount to further promotion of the fabrication efficiency.

Further, there is provided the jig for a wafer according to the invention, wherein in the jig for the wafer of the invention, the inserting pin is formed in a shape of a circular pillar.

In the jig for the wafer according to the invention, the inserting pin is formed in the shape of the circular pillar, and therefore, an outer peripheral face thereof is constituted by a smooth curve. Therefore, in inserting the inserting pin into the through hole, even when an inner face of the through hole is brought into contact with the outer peripheral face of the inserting pin, a defect or the like is difficult to be attached to the wafer. Also in this respect, a chip off or a crack can be prevented from being brought about at the wafer.

According to the method of fabricating the piezoelectric vibrating piece of the invention, the high quality piezoelectric vibrating piece can efficiently be fabricated regardless of the accuracy of the outer shape of the wafer.

Further, the piezoelectric vibrating piece according to the invention is fabricated by the fabricating method, and therefore, high quality formation can be achieved and low cost formation can be achieved.

Further, the piezoelectric vibrator, the oscillator, the electronic apparatus and the radiowave timepiece of the invention include the piezoelectric vibrating piece, and therefore, high quality formation and low cost formation can similarly be achieved.

Further, the high piezoelectric vibrating piece can efficiently be fabricated by utilizing the wafer according to the invention. Further, according to the jig for the wafer of the invention, in fabricating the piezoelectric vibrating piece, the wafer can stably be held while restraining rattling, the reference point can be made to be easy to grasp, and therefore, the fabrication efficiency of the piezoelectric vibrating piece can further promoted.

BRIEF DESCRIPTION OF THE DRAWINGS

FIG. 16A is a top view, and FIG. 16B is a sectional view taken along a line A-A of FIG. 16A;

FIG. 17A is a top view, and FIG. 17B is a sectional view taken along a line B-B of FIG. 17A; FIG. 18A is a top view, and FIG. 18B is a sectional view taken along a line C-C of FIG. 18A.

DETAILED DESCRIPTION OF THE PREFERRED EMBODIMENTS

An embodiment according to the invention will be explained in reference to FIG. 1 through FIG. 9 as follows. Further, according to the embodiment, as a piezoelectric vibrator 1, an explanation will be given by taking an example of a piezoelectric vibrator of a cylinder package type.

Figure 1:
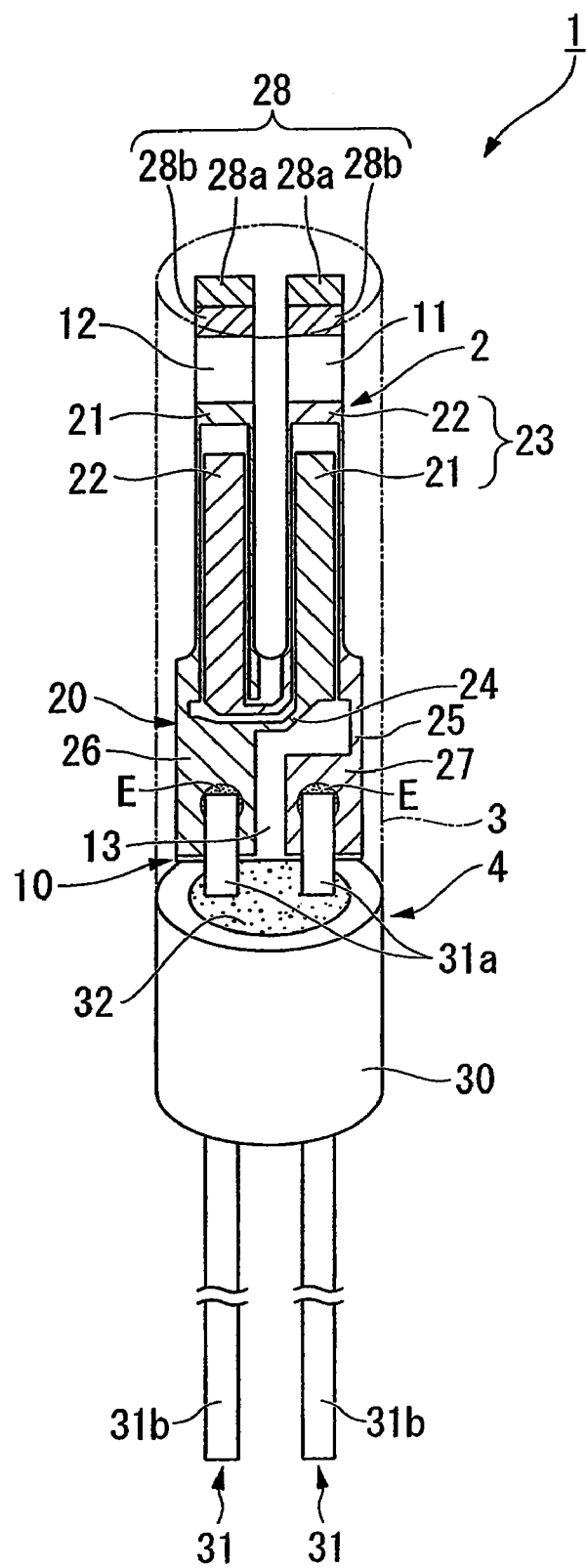
FIG. 1 is a view showing an embodiment of a piezoelectric vibrator according to the invention and is a total view viewed from an upper face side.

As shown by FIG. 1, the piezoelectric vibrator 1 of the embodiment includes a piezoelectric vibrating piece 2, a case 3 containing the piezoelectric vibrating piece 2 at inside thereof, and a plug 4 constituting an airtight terminal of hermetically closing the piezoelectric vibrating piece 2 at inside of the case 3.

Figure 2:
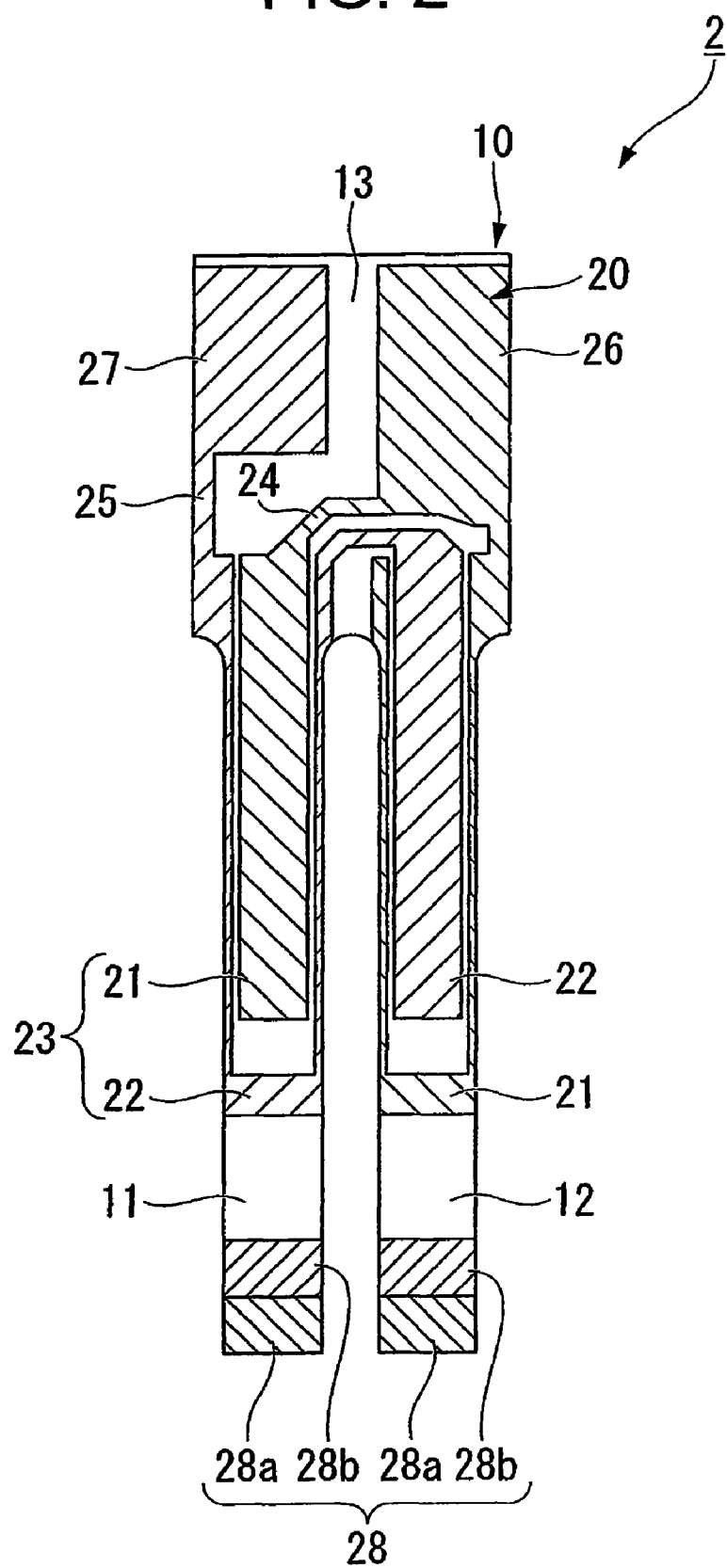
FIG. 2 is a view viewing a piezoelectric vibrating piece constituting the piezoelectric vibrator shown in FIG. 1 from an upper face.
Figure 3:
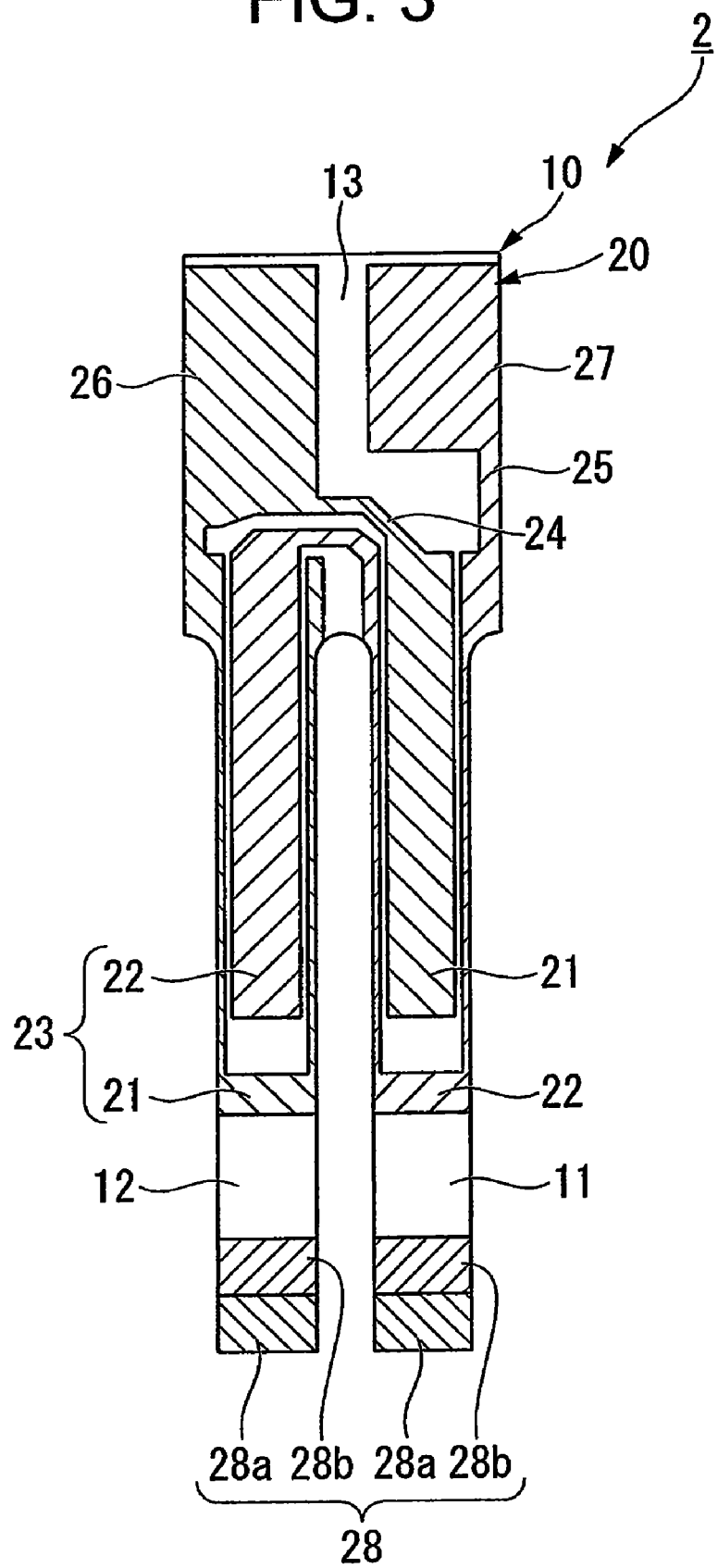
FIG. 3 is a view viewing the piezoelectric vibrating piece constituting the piezoelectric vibrator shown in FIG. 1 from a lower face.

As shown by FIG. 2 and FIG. 3, the piezoelectric vibrating piece 2 is a vibrating piece of a tuning fork type formed by a piezoelectric material of quartz, lithium tantalate, lithium niobate or the like, and is vibrated when applied with a predetermined voltage. Further, the piezoelectric vibrating piece 2 is fabricated from a wafer S mentioned later.

The piezoelectric vibrating piece 2 is constituted by a piezoelectric plate 10 including a pair of vibrating arm portions 11, 12 arranged in parallel and a base portion 13 of integrally fixing base end sides of the pair of vibrating arm portions 11, 12, and an electrode 20 formed on an outer surface of the piezoelectric plate 10 for vibrating the piezoelectric plate 10 when applied with a predetermined voltage.

The electrode 20 is constituted by an exciting electrode 23 including a first exciting electrode 21 and a second exciting electrode 22 formed on outer surfaces of the pair of vibrating arm portions 11, 12 for vibrating the pair of vibrating arm portions 11, 12, and mount electrodes 26, 27 respectively electrically connected to the first exciting electrode 21 and the second exciting electrode 22 by way of lead out electrodes 24, 25.

The pair of exciting electrodes 24, 25 are electrodes of vibrating the pair of vibrating arm portions 11, 12 in directions of being proximate to or remote from each other by a predetermined resonance frequency, and formed on the outer surfaces of the pair of vibrating arm portions 11, 12 in a state of being respectively electrically isolated. Specifically, the first exciting electrode 21 is mainly formed on upper and lower faces of the one vibrating arm portion 11 and on two side faces of the other vibrating arm portion 12, and the second exciting electrode 22 is mainly formed on two side faces of the one vibrating arm portion 11 and on upper and lower faces of the other vibrating arm portion 12.

Further, the exciting electrode 23, the mount electrodes 26, 27 and the lead out electrodes 24, 25 are formed by coating conductive films (electrode films) of, for example, chromium (Cr), Nickel (Ni), aluminum (Al), titanium (Ti) or the like.

Further, front ends of the pair of vibrating arm portions 11, 12 are coated with weight metal films 28 for adjusting a vibrating state of its own to vibrate within a range of a predetermined frequency. Further, the weight metal film 28 is divided to a rough adjusting film 28a used in roughly adjusting the frequency, and a fine adjusting film 28b used in adjusting finely. By adjusting a frequency by utilizing the roughly adjusting film 28a and the fine adjusting film 28b, the frequency of the pair of vibrating arm portions 11, 12 can be confined to a range of a nominal frequency of a device.

As shown by FIG. 1, the case 3 is formed in a shape of a bottomed cylinder and is press-fit to be fitted to fix to an outer periphery of a stem 30 mentioned later of the plug 4 in a state of containing the piezoelectric vibrating piece 2 at inside thereof. Further, press-fit of the case 3 is carried out under a vacuum atmosphere and a space surrounding the piezoelectric vibrating piece 2 at inside of the case 3 is brought into a state of being maintained in vacuum.

The plug 4 includes the stem 30 for hermetically sealing the case 3, 2 pieces of lead terminals 31 in which one end sides arranged in parallel to penetrate the stem 30 by interposing the stem 30 are constituted by inner leads 31a for mounting (mechanically bonding and electrically connecting) the piezoelectric vibrating pieces 2, and other end sides of which are constituted by outer leads 31b electrically connected to outside, and an insulating film member 32 filled on an inner side of the stem 30 for fixing the stem 30 and the lead terminal 31.

The stem 30 is formed in a ring-like shape by a metal material. Further, a material of the filling member 32 is, for example, borosilicate glass. Further, a surface of the lead terminal 31 and an outer periphery of the stem 30 are respectively coated with plantings, not illustrated, of the same material.

Portions of 2 pieces of the lead terminals 31 projected to inside of the case 3 constitute the inner leads 31a and portions thereof projected to outside of the case 3 constitute the outer leads 31b. Further, the inner leads 31a and the mount electrodes 26, 27 are mounted by way of conductive bumps E. That is, the inner leads 31a and the mount electrodes 26, 27 are mechanically bonded and simultaneously electrically connected by way of the bumps E. As a result, the piezoelectric vibrating pieces 2 are brought into a state of being mounted to 2 pieces of the lead terminals 31.

Here, an example of dimensions and materials of essential parts constituting the plug 4 will be described.

A diameter of the lead terminal 31 is, for example, about 0.12 mm, and as a material of a base member of the lead terminal 31, kovar (FeNiCo alloy) is commonly used. Further, as a material of plating coated on an outer surface of the lead terminal 31 and an outer periphery of the stem 30, Cu is used as a matrix metal film, and as a finish metal film, heat resistant solder plating (alloy of tin and lead, a weight ratio thereof is 1:9), silver (Ag), tin copper alloy (SnCu), gold tin alloy (AuSn) or the like is used.

Further, inside of the case 3 is made to be able to be sealed in airtight in a vacuum state by carrying out clod pressure welding in vacuum on an inner periphery of the case 3 while interposing a metal film (plating layer) coated on the outer periphery of the stem 30.

When the piezoelectric vibrator 1 constituted in this way is operated, a predetermined drive voltage is applied to the outer leads 31b of 2 pieces of the lead terminals 31. Thereby, a current can be made to flow to the exciting electrode 23 including the first exciting electrode 21 and the second exciting electrode 22 by way of the inner leads 31a, the bumps E, the mount electrodes 26, 27 and the lead out electrodes 24, 25, and the pair of vibrating arm portions 11, 12 can be vibrated in direction of being proximate to and remote from each other by a predetermined frequency. Further, by utilizing the vibration of the pair of vibrating arm portions 11, 12, the piezoelectric vibrator 1 can be utilized as a timing source, a reference signal source or the like of a time source, a control signal.

Figure 4:
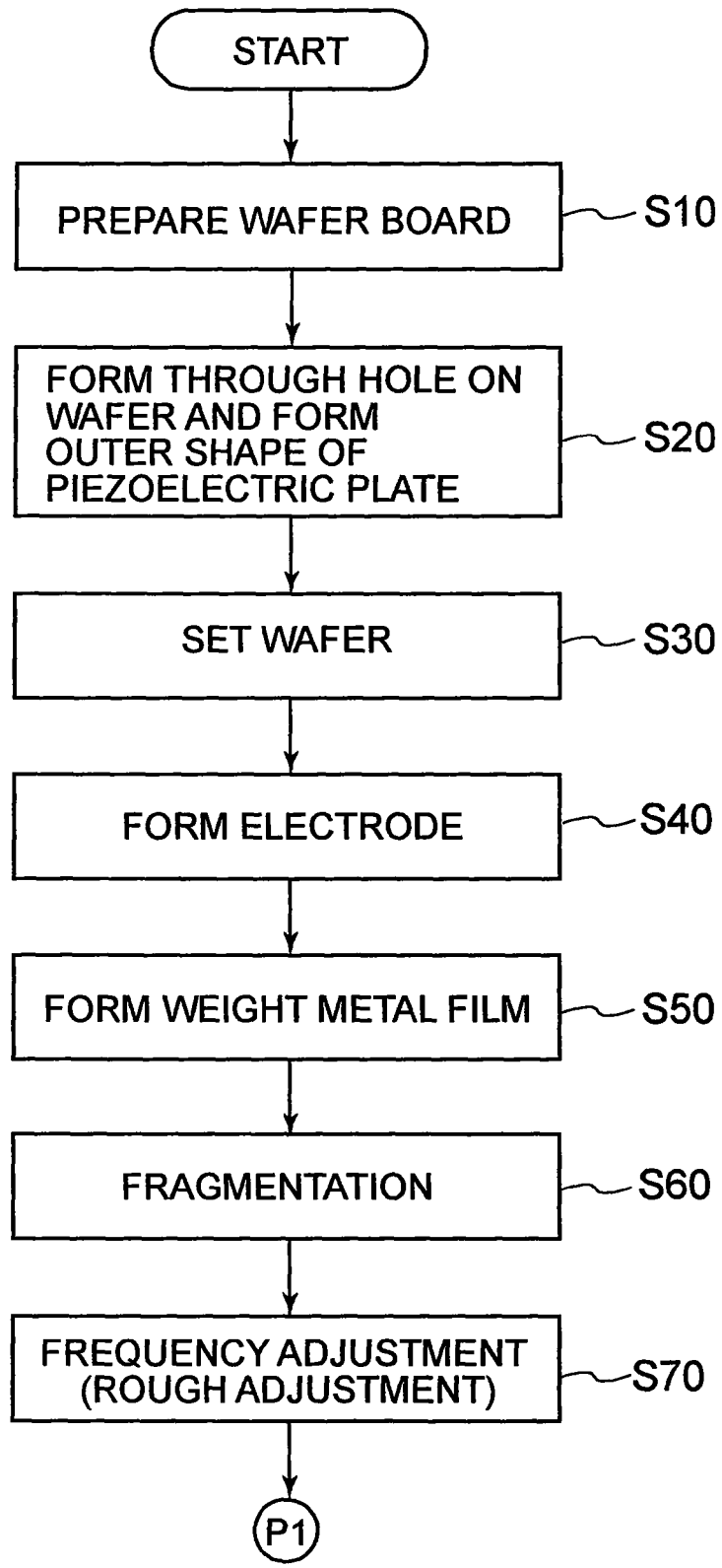
FIG. 4 is a flowchart showing a flow in fabricating the piezoelectric vibrator shown in FIG. 1.
Figure 5:
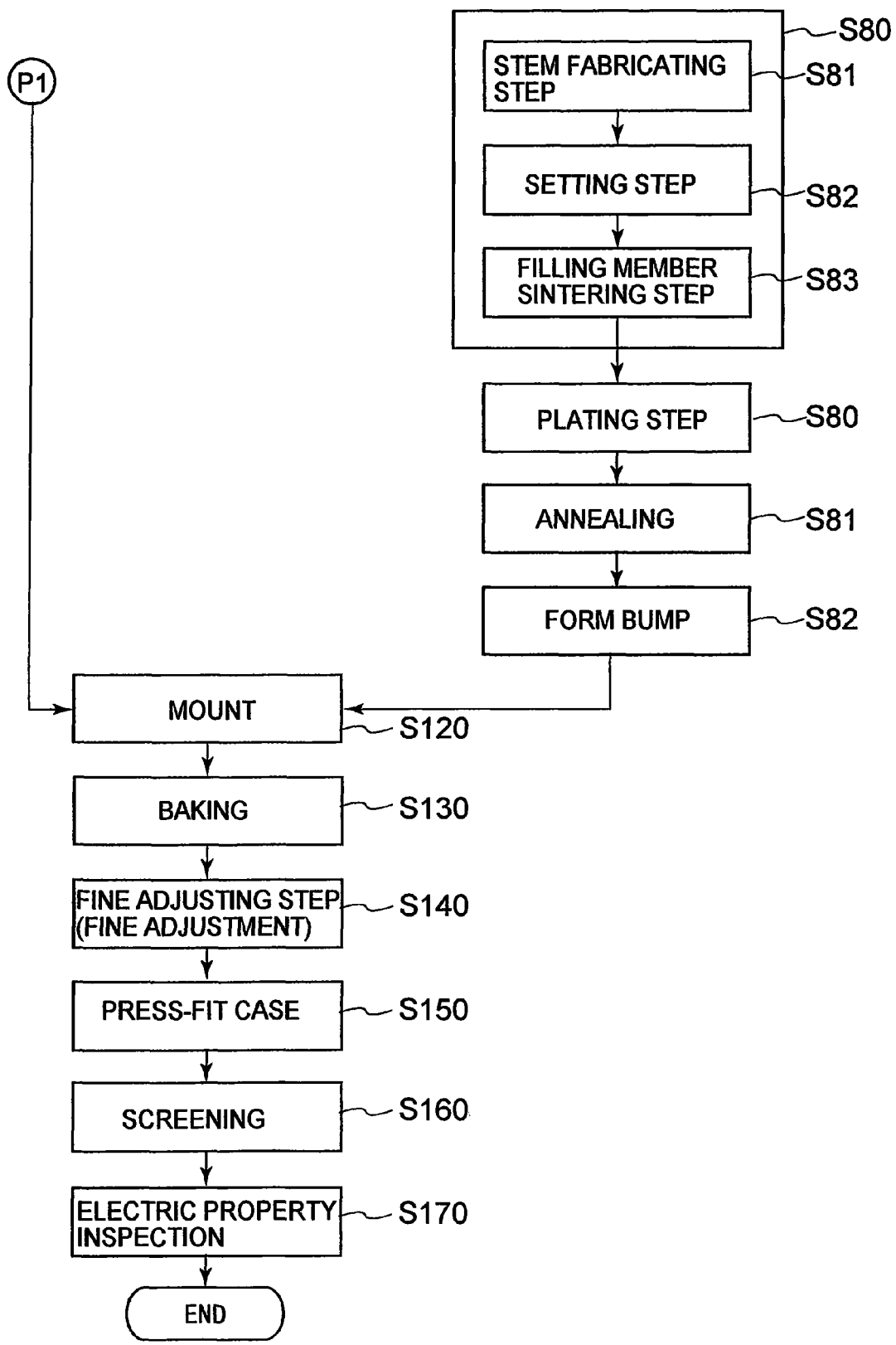
FIG. 5 is a continuation of the flowchart shown in FIG. 4.
Figure 6:
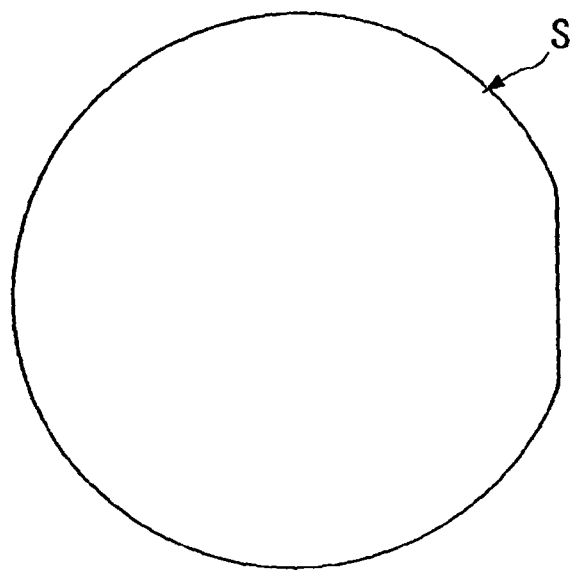
FIG. 6 is a view showing one step in fabricating the piezoelectric vibrator shown in FIG. 1 and is a top view of a wafer.

Next, a method of fabricating the piezoelectric vibrating piece 2 and the piezoelectric vibrator 1 mentioned above will be explained as follows in reference to a flowchart shown in FIG. 4 and FIG. 5.

First, a step of fabricating a plurality of the piezoelectric vibrating pieces 2 at a time by utilizing the wafer S made of the piezoelectric material is carried out. In carrying out the step, first, the wafer S shown in FIG. 6 finished highly accurately to a predetermined thickness by finishing predetermined polishing is prepared (S10). Further, according to the embodiment, an explanation will be given by taking an example of a case of using the wafer S in a circular plate shape. Next, there is carried out an outer shape forming step of forming 2 or more of through holes 40 and forming outer shapes of the plurality of piezoelectric plates 10 simultaneously with the through holes 40 by etching the wafer S by a photolithography technology by constituting reference points G by centers of the through holes 40 (S20).

Figure 7:
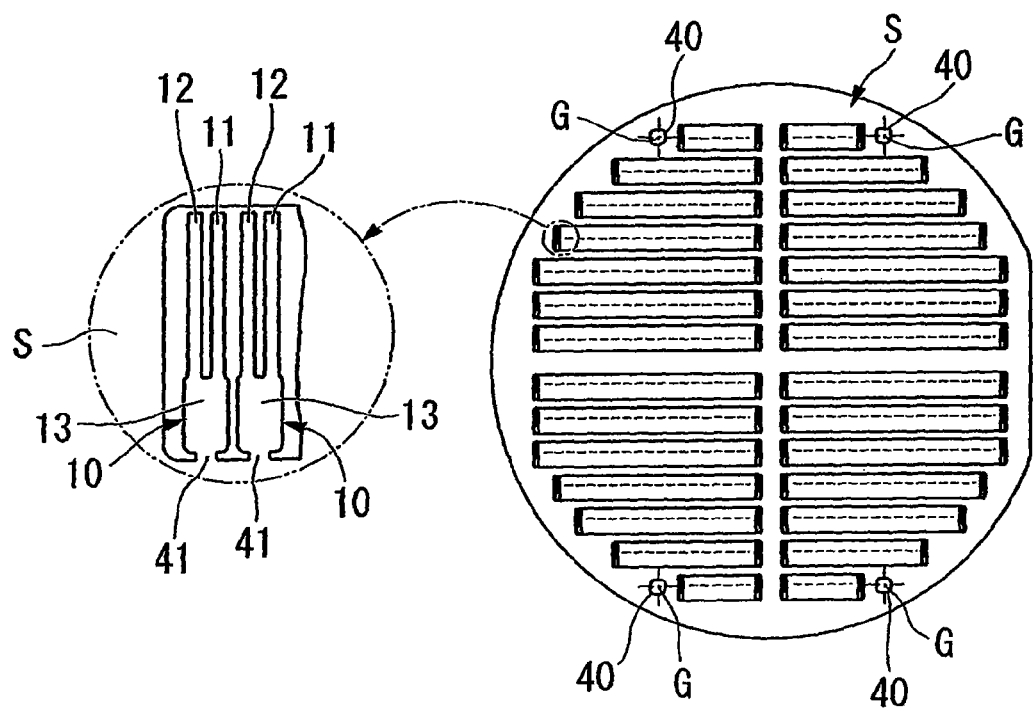
FIG. 7 is a view showing one step in fabricating the piezoelectric vibrator shown in FIG. 1 and is a view showing a state of forming 4 of through holes and forming outer shapes of a plurality of piezoelectric plates by etching the wafer shown in FIG. 6.

Thereby, as shown by FIG. 7, there can be provided the wafer S including the through holes 40 and a plurality of the piezoelectric plates 10 outer shapes of which are formed by constituting the reference points G by the centers of the through holes 40. Further, according to the embodiment, an explanation will be given by taking an example of a case of forming 4 of the through holes 40. Further, the plurality of piezoelectric plates 10 are brought into a state of being connected to the wafer S by way of connecting portions 41 during a time period until a cutting step which is carried out later.

Particularly, the through hole 40 is formed simultaneously with forming the outer shape of the piezoelectric plate 10, and therefore, positions of all of the piezoelectric plates 10 can accurately be specified by the reference points G.

Next, a wafer set step of mounting the wafer S on a flat plate portion 46 of a jig 45 for the wafer is carried out (S30). Here, the jig 45 for wafer will simply be explained.

Figure 8:
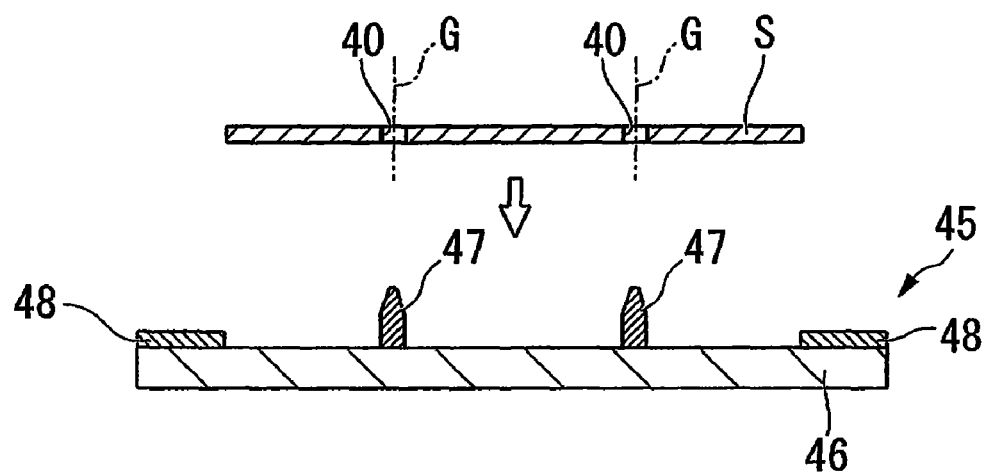
FIG. 8 is a sectional view of a jig for a wafer used in fabricating the piezoelectric vibrator shown in FIG. 1.

As shown by FIG. 8, the jig 45 for the wafer includes the flat plate portion 46 of mounting the wafer S on an upper face, 4 (numbers the same as that of through holes 40) of inserting pins 47 constituted by a size capable of being inserted into the through hole 40 and projected in a direction substantially orthogonal to the upper face of the flat plate portion 46 from above the flat plate portion 46. Therefore, the wafer S is made to be able to be mounted on the flat plate portion 46 by inserting the inserting pin 47 into the through hole 40.

The inserting pin 47 is formed in a shape of a circular pillar and is constituted by a taper shape of converging a front end. Further, the inserting pin 47 is formed to be longer than a thickness of the wafer S. Further, the flat plate portion 46 is made to be able to be attached with a spacer 48 to surround a surrounding of the wafer S when the wafer S is mounted. The spacer 46 is constituted by a thickness substantially the same as that of the wafer S to prevent a stepped difference from being brought about between the spacer 48 and the wafer S.

Figure 9:
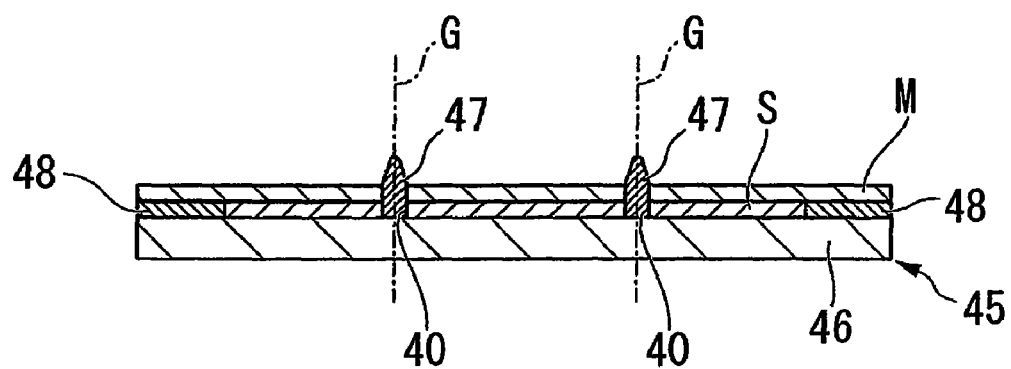
FIG. 9 is a view showing one step in fabricating the piezoelectric vibrator shown in FIG. 1 and is a view showing a state of setting the wafer shown in FIG. 7 to a jig for a wafer shown in FIG. 8.

Further, the wafer set step is carried out by utilizing the jig 45 to the wafer constituted in this way. That is, as shown by FIG. 9, the wafer S is mounted on the flat plate portion 46 by respectively inserting 4 of the inserting pins 47 into 4 of the through holes 40. Thereby, the wafer S is stably held by the jig 45 for the wafer without rattling. Further, there is brought about a state of inserting the inserting pin 47 at inside of the through hole 40, and therefore, the center of the inserting pin 47 can be replaced by the reference point G and the reference point G is made to be easy to grasp.

Successively, there is carried out an electrode forming of forming the electrode 20 including the exciting electrode 23, the lead out electrodes 24, 25, the mount electrodes 26, 27 by forming an electrode film, not illustrated, on outer surfaces of the plurality of piezoelectric plates 10 and carrying out patterning (S40). At this occasion, as shown by FIG. 9, the above-described patterning can be carried out by overlapping a mask M previously formed with a predetermined pattern on the wafer S and pertinently carrying out exposing, developing and etching by utilizing the mask M.

At this occasion, positioning of the mask M is carried out by constituting the reference point G by the center of the through hole 40. Therefore, different from the case of the background art constituting the reference by the outer shape of the wafer S, the mask M can highly accurately be positioned to the plurality of piezoelectric plates 10 without being influenced by an accuracy of the outer shape of the wafer S. Further, 4 of the through holes 40 are formed, and therefore, 4 of the reference points G can be ensured, and positioning can be carried out without being influenced by a direction of the wafer S. Therefore, there is not a concern of bringing about a positional shift caused by an accuracy of the outer shape of the wafer S.

Therefore, the electrode 20 can highly accurately be patterned to the plurality of piezoelectric plates 10. Further, there is not a stepped difference between the wafer S and the spacer 48, and therefore, the mask M can stably be overlapped above the wafer S.

Further, after forming the electrode 20, the weight metal film 28 is formed by pertinently carrying out exposing and developing and etching by switching the mask M (S50). Also in this case, similarly, positioning of the mask M and the wafer S can highly accurately be carried out, and therefore, the weight metal film 28 can accurately be patterned to the plurality of piezoelectric plates 10.

Next, there is carried out a cutting step of cutting to separate the plurality of piezoelectric plates 10 and the wafer S to fragment by cutting the connecting portion 41 of connecting the wafer S and the piezoelectric plates 10 (S60). Also in this case, similarly, cutting is carried out by pertinently carrying out exposing and developing and etching by switching the mask M. Also in this case, positioning of the mask M and the wafer S can highly accurately be carried out invariably, and therefore, the connecting portion 41 can accurately be cut.

By carrying out the cutting step, a plurality of the piezoelectric vibrating pieces 2 formed with the electrodes 20 and the weight metal films 28 on outer surfaces of the piezoelectric plates 10 can be fabricated at a time from the single wafer S. At the time point, a step of fabricating the piezoelectric vibrating piece 2 is finished.

Particularly, in fabricating the piezoelectric vibrating piece 2, the positioning of the mask M can highly accurately be carried out as described above without being influenced by an accuracy of the outer shape of the wafer S different from the background art. Therefore, the high quality piezoelectric vibrating piece 2 can be fabricated. Further, the wafer S is stably held by the jig 45 for the wafer, the reference point G can firmly be grasped by the inserting pin 47, and therefore, the positioning operation can easily be carried out. Therefore, a fabrication efficiency can further be promoted than that of the background art, which can amount to low cost formation of the piezoelectric vibrating piece 2.

Further, in forming the through hole 40 at the wafer S, when the wafer S is viewed planely, the through hole 40 is formed to constitute a circular shape. Therefore, even when an external force is operated to the through hole 40 in forming the through hole 40 or after forming the through hole 40, the external force can be prevented from being concentrated on one point and the force can be dispersed. Therefore, a crack is difficult to be produced on the wafer S. Therefore, a chip off, a crack or the like can be prevented from being produced on the wafer S. As a result, the fabrication efficiency can further be promoted by improving yield.

Further, the inserting pin 47 of the embodiment is formed in the shape of the circular pillar, and therefore, an outer peripheral face thereof becomes a smooth curved face. Therefore, in inserting the inserting pin 47 to inside of the through hole 40, even when an inner face of the through hole 40 is brought into contact with an outer peripheral face of the pin 47, a defect or the like is difficult to be attached to the wafer S. Also in this respect, a chip off, a crack or the like can be prevented from being brought about at the wafer S.

In addition thereto, according to the inserting pin 47 of the embodiment, the front end is formed in the taper shape and is constituted by a converging shape. Therefore, when the inserting pin 47 is inserted to inside of the through hole 40, the inserting pin 47 is difficult to be caught. Also in this respect, a defect or the like can be made to be difficult to be attached to the wafer S. Further, the wafer set step can further smoothly be carried out, and therefore, the fact can amount to further promotion of the fabrication efficiency.

Next, a step of fabricating the piezoelectric vibrator 1 is carried out. Further, before mounting the piezoelectric vibrating piece 2 to the lead terminal 31, a resonance frequency is roughly adjusted (S70). This is carried out by changing weight by irradiating laser light to the rough adjusting film 28a of the weight metal film 28 by partially evaporating a portion thereof. Further, the fine adjustment of adjusting the resonance frequency further highly accurately will be carried out later. An explanation thereof will be given later.

In fabricating the piezoelectric vibrator 1, first, an airtight terminal fabricating step of fabricating the plug 4 is carried out (S80). Specifically, first, the stem 30 is fabricated by a stem fabricating step (S81). That is, a bottomed cylinder member is formed by working a plate member having a conductivity of iron nickel cobalt alloy, iron nickel alloy or the like into a lance, thereafter, carrying out deep drawing by a plurality of times. Further, the stem 30 is fabricated by forming an opening at a bottom face of the cylinder member and cutting to separate the cylinder member from the plate member by drawing an outer shape thereof.

Successively, a setting step of respectively setting the lead terminal 31 and the filling member 32 is carried out (S82). First, the fabricated stem 30 is set to an exclusive jig, not illustrated, thereafter, the filling member 32 previously sintered in a ring-like shape is set to an inner portion of the stem 30, and the lead terminal 31 is set to penetrate the filling member 32.

After integrating the stem 30 and the lead terminal 31 and the filling member 32 by the setting step, the jig is put into a heating furnace and the filling member 32 is sintered in a temperature atmosphere around 1000° C. (S83). Thereby, an interval between the filling member 32 and the lead terminal 31 and an interval between the filling member 32 and the stem 30 are completely sealed to attach to constitute a structure withstanding airtightness. Further, the plug 4 can be provided by being taken out from the jig. At the time point, the airtight terminal fabricating step is finished.

Next, a plating step of coating a metal film of the same material to an outer surface of the lead terminal 31 and an outer periphery of the stem 30 by a wet plating method is carried out (S90). As a pretreatment therefor, an outer surface of the lead terminal 31 and the outer periphery of the stem 30 are cleaned, degreased by an alkaline solution, thereafter, cleaned by an acid by a solution of hydrochloric acid and sulfuric acid. After finishing the pretreatment, a matrix metal film is formed on the outer surface of the lead terminal 31 and the outer peripheral face of the stem 30. For example, Cu plating or Ni plating is coated by a film thickness of substantially 2 μm through 5 μm. Successively, a finish metal film is formed on the matrix metal film. For example, other than a single material of tin, silver or the like, heat resistant plating, tin copper alloy, tin bismuth alloy, tin antimony alloy or the like is coated by a film thickness of substantially 8 μm through 15 μm.

In this way, by coating a metal film made of the matrix metal film and the finish metal film, the inner leads 31a and the piezoelectric vibrating piece 2 can be connected. Further, not only the connection of the piezoelectric vibrating piece 2, but cold pressure welding of the stem 30 can be carried out and airtight bonding can be carried out since the metal film coated on the outer periphery of the stem 30 is provided with a property of being soft and elastically deformed.

Successively, in order to stabilize the metal film, annealing is carried out in a furnace of a vacuum atmosphere (S100). For example, heating is carried out for 1 hour at a temperature of 170° C. Thereby, whisker can be restrained from being brought about by adjusting a composition of an intermetallic compound formed at an interface of a material of the matrix metal film and a material of the finish metal film. Mount step can be carried out at a time point of finishing the annealing. Further, although an example of a case of coating the metal film by the wet plating method is taken, the invention is not limited to the case, but, for example, the coating may be carried out by a vapor deposition method, a chemical gas phase method or the like.

Further, according to the embodiment, the conducting bumps E of gold or the like are formed at front ends of the inner leads 31a for mount step carried out successively after finishing annealing (S110). Further, a mount step of bonding the mount electrodes 26, 27 of the piezoelectric vibrating piece 2 to the inner leads 31a is carried out (S120). Specifically, the inner lead 31a and the piezoelectric vibrating piece 2 are overlapped by a predetermined pressure in a state of interposing the bump E therebetween while heating the bump E. Thereby, the inner leads 31a and the mount electrodes 26, 27 can be connected by way of the bumps E. As a result, the piezoelectric vibrating piece 2 can be mounted. That is, the piezoelectric vibrating piece 2 is brought into a state of being mechanically supported by and electrically connected to the lead terminals 31.

Further, although in carrying out bump connection, mounting is carried out by carrying out heating and pressurizing, the bump connection may be carried out by utilizing an ultrasonic wave.

Next, before carrying out a sealing step, in order to eliminate a strain by the above-described mounting, baking is carried out at a predetermined temperature (S130). Successively, frequency adjustment (fine adjustment) of the piezoelectric vibrating piece 2 is carried out (S140). Specifically explaining the frequency adjustment, in a state of putting a total into a vacuum chamber, the piezoelectric vibrating piece 2 is vibrated by applying a voltage between the outer leads 31b. Further, the frequency is adjusted by vaporizing the fine adjusting film 28b of the weight metal film 28 by a laser while measuring the frequency. Further, in order to carry out frequency measurement, the measurement can be accurately carried out by pressing a front end of a probe, not illustrated, to the outer lead 31b. By carrying out the frequency adjustment, the frequency of the piezoelectric vibrating piece 2 can be adjusted within a previously determined frequency range.

Further, although in the fine adjustment and the rough adjustment which is carried out previously, the frequency adjustment is carried out by vaporizing the weight metal film 28 by irradiating a laser, not laser but argon ion may be utilized. In this case, the frequency adjustment is carried out by removing the weight metal film 28 by carrying out sputtering by irradiating argon ion.

Finally, a sealing step of sealing the piezoelectric vibrating piece 2 in airtight by press-fitting the case 3 to the stem 30 to contain the mounted piezoelectric vibrating piece 2 to an inner portion thereof is carried out (S150). Specifically explaining, the case 3 is press-fit to the outer periphery of the stem 30 while applying a predetermined load in vacuum. Then, the metal film formed on the outer periphery of the stem 30 is elastically deformed, and therefore, airtight sealing can be carried out by cold pressure welding. Thereby, the piezoelectric vibrating piece 2 can be hermetically closed to be sealed in vacuum to inside of the case 3.

Further, before carrying out the step, it is preferable to separate moisture or the like adsorbed to surface by sufficiently heating the case 3 and the plug 4.

Further, after finishing to fix the case 3, screening is carried out (S160). The screening is carried out for stabilizing the frequency and a resonance resistance value, and restraining a metal whisker caused by a compressive stress from being brought about at a fitting portion press-fit with the case 3. After finishing the screening, an electric property inspection of an inner portion is carried out (S170). That is, the resonance frequency, the resonance resistance value, a drive level property (excited power dependency of resonance frequency and resonance resistance value) or the like are measured and checked. Further, an insulating resistance property or the like is checked along therewith. Further, finally, a dimension, a quality or the like is finally checked by carrying out an outlook inspection of the piezoelectric vibrator 1. Thereby, the piezoelectric vibrator 1 shown in FIG. 1 can be fabricated.

Particularly, the piezoelectric vibrator 1 of the embodiment is provided with the piezoelectric vibrating piece 2 having a high quality and brought into low cost formation, and therefore, high quality formation and low cost formation can be achieved more than that of the background art.

Further, the piezoelectric vibrator 1 of the embodiment is of the cylinder package type of hermetically closing the piezoelectric vibrating piece 2 at inside of the case 3, and therefore, the piezoelectric vibrating piece 2 can be vibrated without being influenced by dust and dirt or the like. Therefore, the piezoelectric vibrating piece 2 can highly accurately be vibrated, and high performance formation can be achieved.

Further, although according to the embodiment, an explanation has been given by taking an example of the piezoelectric vibrator 1 having the piezoelectric vibrating piece 2 of the tuning fork type, the embodiment is not limited to the piezoelectric vibrator 1.

Figure 10:
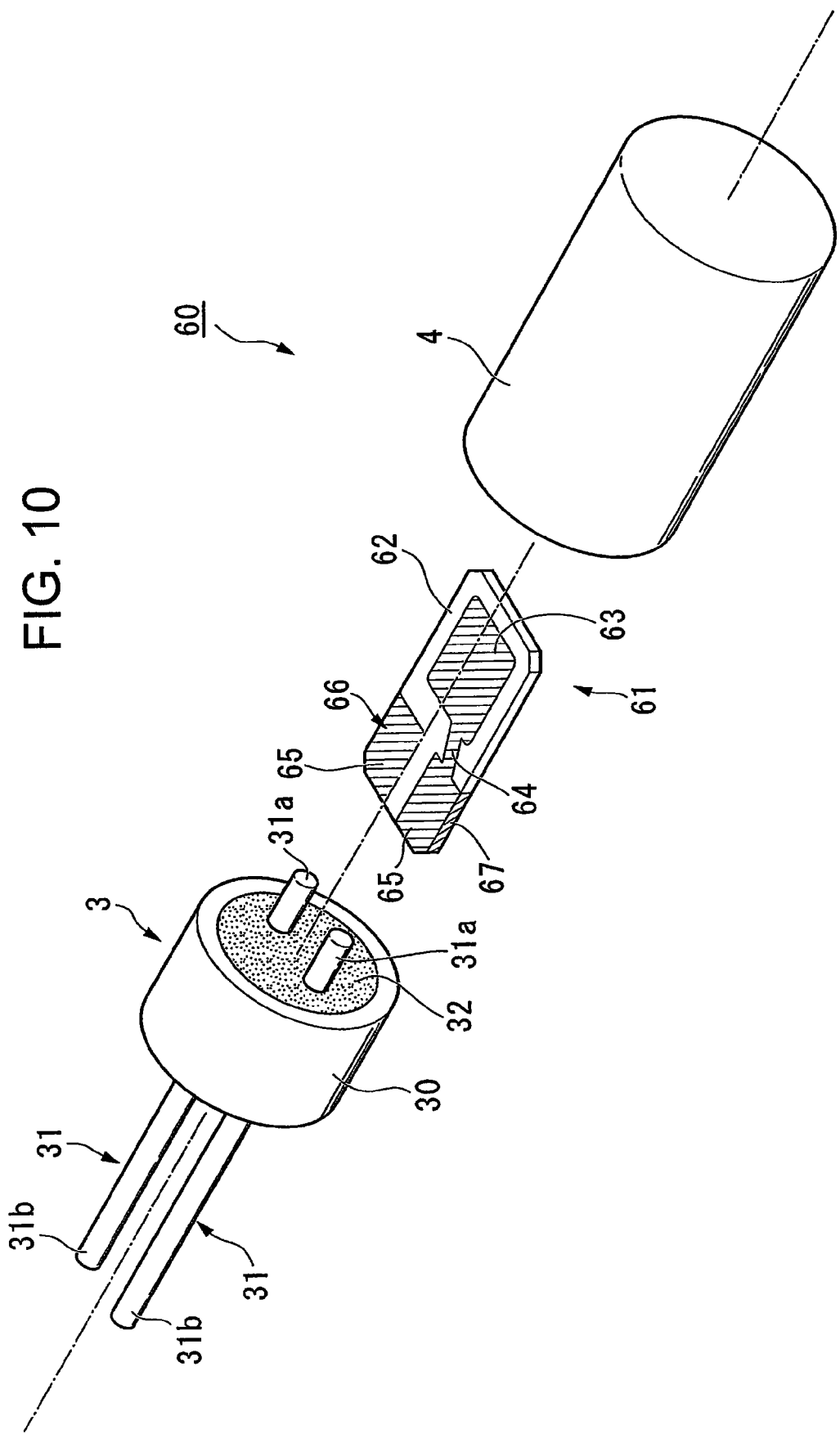
FIG. 10 is a view showing other example of a piezoelectric vibrator according to the invention and is a perspective view of a piezoelectric vibrating piece carrying out a thickness slipping vibration.

As shown by FIG. 10, a thickness slipping vibrator (piezoelectric vibrator) 60 having a thickness slipping vibrating piece (piezoelectric vibrating piece) 61 will do. The thickness slipping vibrating piece 61 includes a piezoelectric plate 62 formed in a plate shape by a constant thickness from the wafer S, and an electrode 66 including an exciting electrode 63, a lead out electrode 64 and a mount electrode 65. The piezoelectric plate 62 is formed in, for example, a rectangular shape in an outer shape thereof, and is formed such that the exciting electrodes 63 are opposed to each other substantially at center portions of both faces thereof. An end portion of the piezoelectric plate 62 is formed with the mount electrode 65 electrically connected to the exciting electrode 63 by way of the lead out electrode 64. Further, the mount electrode 65 connected to one of the exciting electrodes 63 and the mount electrode 65 connected to other of the exciting electrodes 63 are respectively formed on the both faces of the piezoelectric plate 62. At this occasion, the mount electrode 65 formed on one face of the piezoelectric plate 62 is electrically connected to the mount electrode 65 formed on other face thereof by way of a side face electrode 67 formed on a side face of the piezoelectric plate 62.

Even in the thickness slipping vibrator 60 constituted in this way, the thickness slipping vibrating piece 61 can be fabricated by high quality and low cost more than that of the background art, and therefore, high quality formation and low cost formation of the thickness slipping vibrator 60 per se can be achieved.

Further, the piezoelectric vibrator 1 of the cylinder package type may be constituted by a surface mounting type vibrator 70 fixed by a mold resin portion 71.

Figure 11:
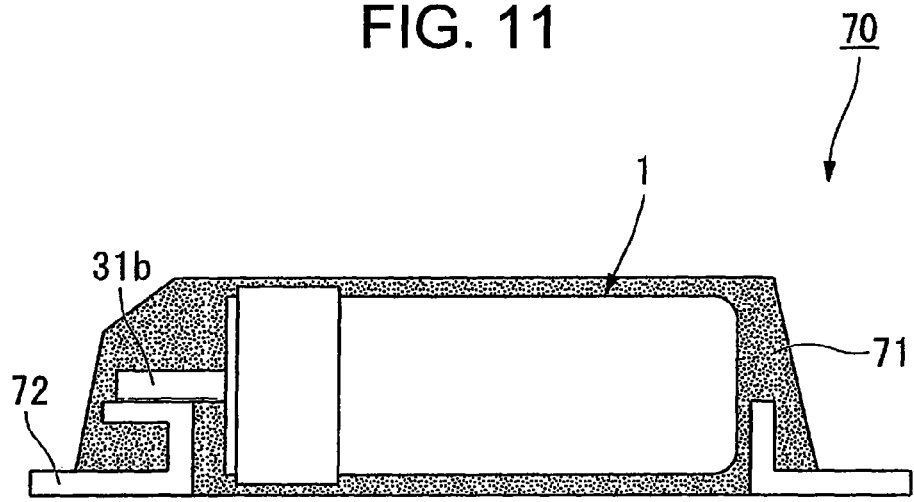
FIG. 11 is a sectional view showing a surface mounting type oscillating piece having a piezoelectric vibrator according to the invention.
Figure 12:
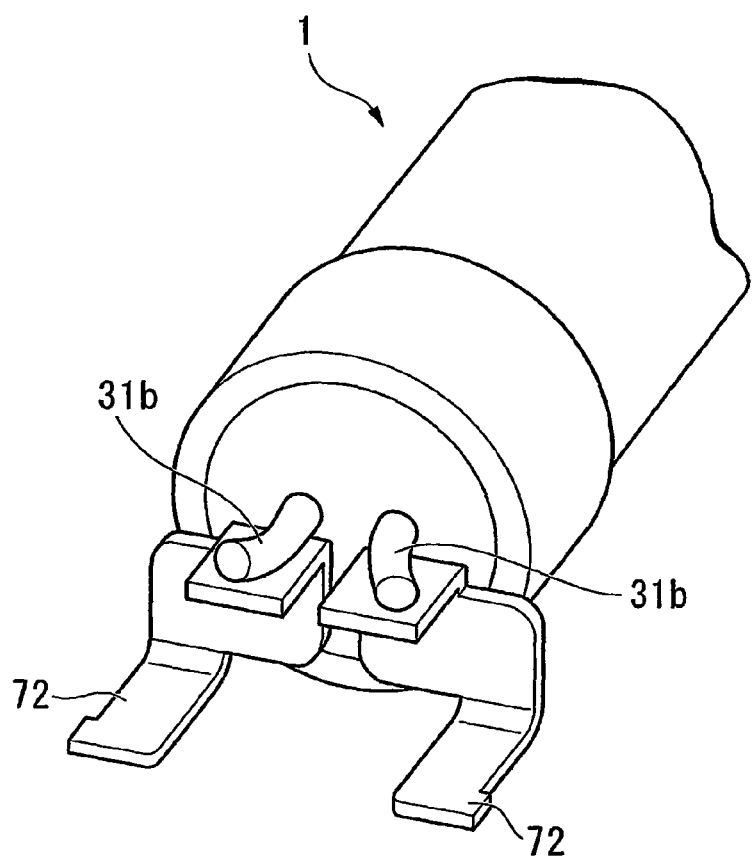
FIG. 12 is a perspective view showing a relationship of attaching the piezoelectric vibrator shown in FIG. 11 and an outer portion connecting terminal.

As shown by FIG. 11 and FIG. 12, the surface mounting type vibrator 70 includes the mold resin portion 71 fixing the piezoelectric vibrator 1 by a predetermined shape, and an outer portion connecting terminal 72 one end side of which is electrically connected to the outer lead 31b and other end side is electrically connected to outside by being exposed at a bottom face of the mold resin portion 71.

The outer portion connecting terminal 72 is formed in a channel-like shape in a section thereof by a metal material of copper or the like. By fixing the piezoelectric vibrator 1 by the molding portion 71 in this way, the piezoelectric vibrator 1 can stably be attached to a circuit board or the like, and therefore, the piezoelectric vibrator 1 is easier to use and an easiness of use is promoted.

Next, an embodiment of an oscillator according to the invention will be explained in reference to FIG. 13.

Figure 13:
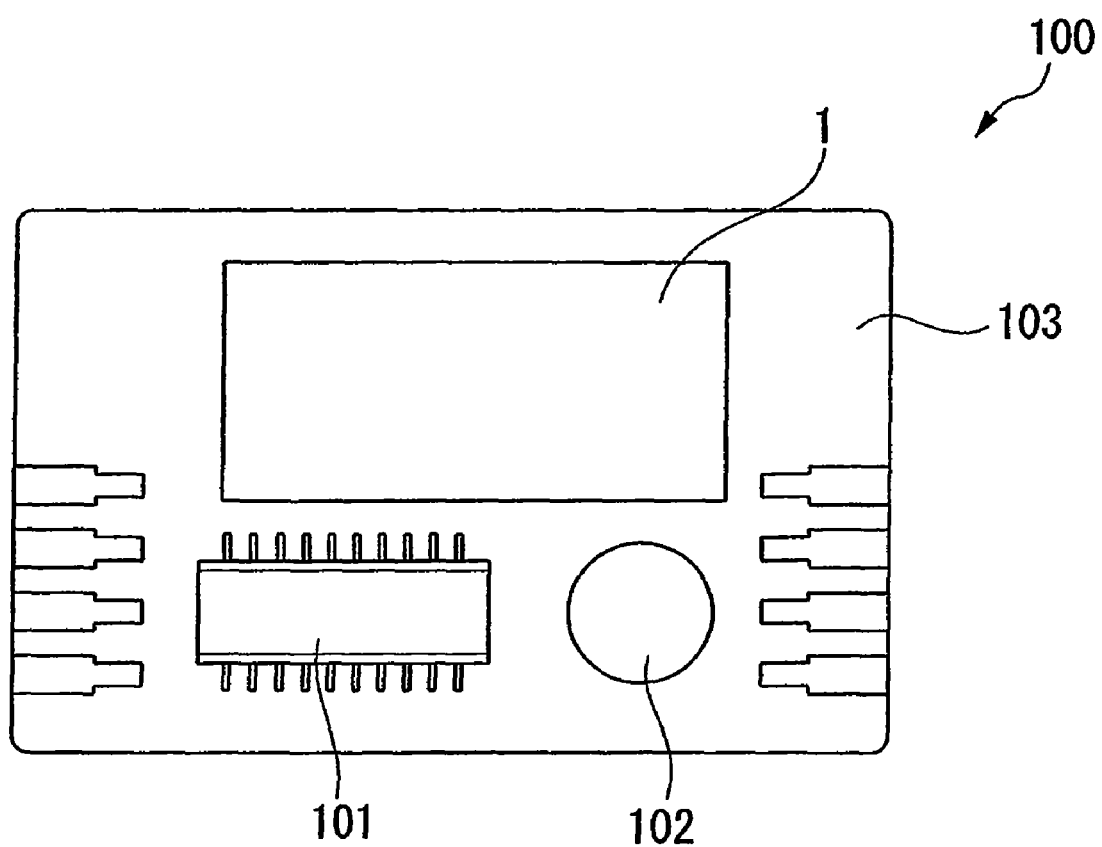
FIG. 13 is a constitution view showing an embodiment of an oscillator according to the invention.

According to an oscillator 100 of the embodiment, as shown by FIG. 13, the piezoelectric vibrator 1 is constituted as an oscillating piece electrically connected to an integrated circuit 101. The oscillator 100 includes a board 103 mounted with an electronic part 102 of a capacitor or the like. The board 103 is mounted with the integrated circuit 101 for the oscillator, and the piezoelectric vibrator 1 is mounted to a vicinity of the integrated circuit 101. The electronic part 102, the integrated circuit 101 and the piezoelectric vibrator 1 are electrically connected respectively by wiring patterns, not illustrated. Further, the respective constituent parts are molded by a resin, not illustrated.

In the oscillator 100 constituted in this way, when a voltage is applied to the piezoelectric vibrator 1, the piezoelectric vibrating piece 2 at inside of the piezoelectric vibrator 1 is vibrated. The vibration is converted into an electric signal by a piezoelectric property provided to the piezoelectric vibrating piece 2 and is inputted to the integrated circuit 101 as an electric signal. The inputted electric signal is variously processed by the integrated circuit 101 and is outputted as a frequency signal. Thereby, the piezoelectric vibrator 1 is functioned as an oscillating piece.

Further, by selecting a constitution of the integrated circuit 101 in accordance with a request of an RTC (real time clock) module or the like, other than a single function oscillator for a timepiece, a function of controlling date or time of operating the apparatus or outside apparatus, or providing time, calendar or the like can be added.

According to the oscillator 100 of the embodiment, the piezoelectric vibrator 1 brought into high quality formation and low cost formation is provided, and therefore, also the oscillator 100 per se can achieve high quality formation similarly by promoting a reliability of an operation and can achieve low cost formation. Further, in addition thereto, a highly accurate frequency signal which is stable over a long period of time can be provided.

Figure 14:
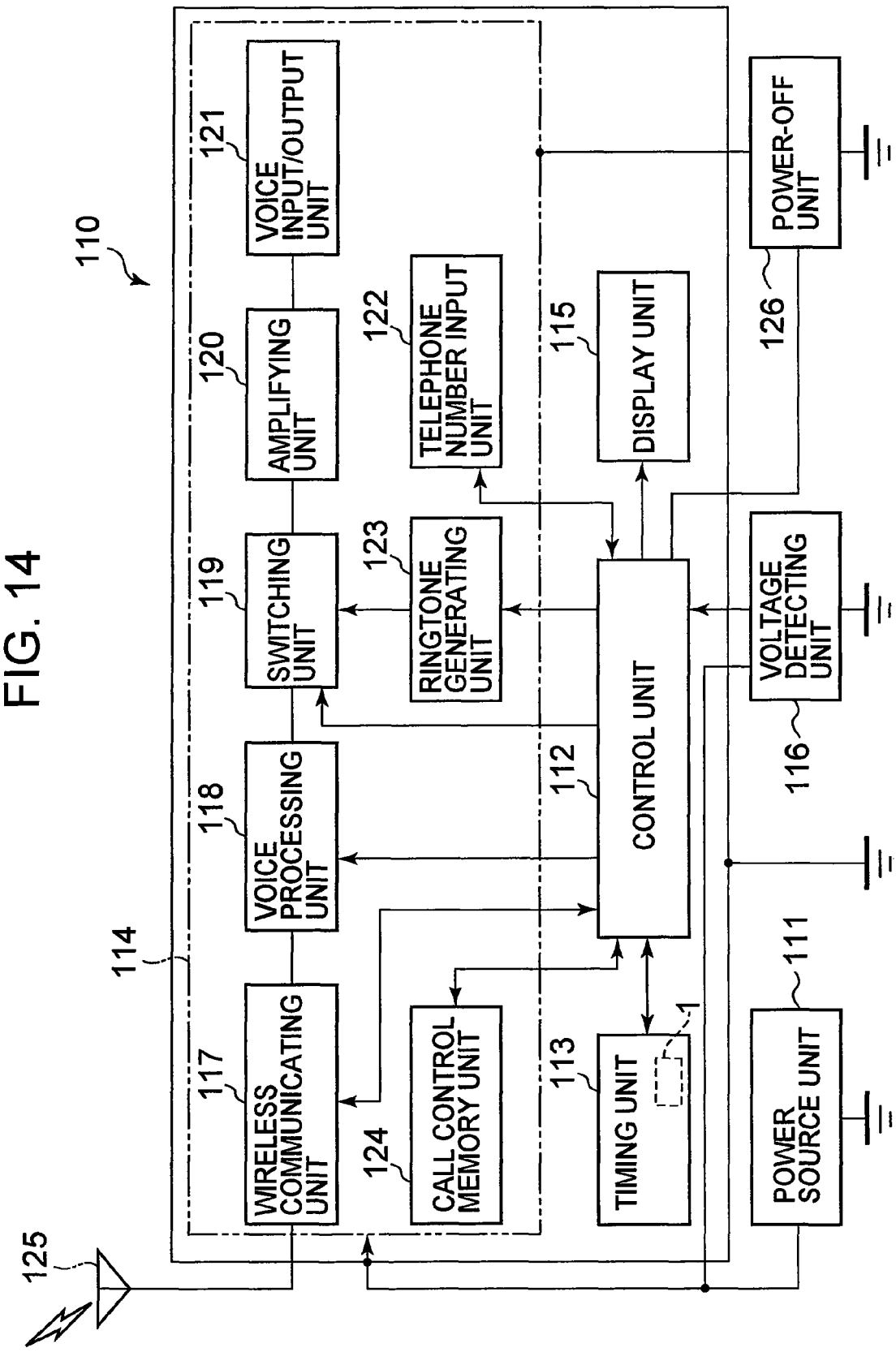
FIG. 14 is a constitution view showing an embodiment of an electronic apparatus according to the invention.

Next, an embodiment of an electronic apparatus according to the invention will be explained in reference to FIG. 14. Further, as an electronic apparatus, an explanation will be given by taking an example of a portable information apparatus 110 having the piezoelectric vibrator 1 mentioned above. First, the portable information apparatus 110 of the embodiment is represented by a portable telephone and develops and improves a wristwatch according to the background art. An outlook thereof is similar to a wristwatch, a liquid crystal display is arranged at a portion in correspondence with a dial and current time or the like can be displayed on a screen thereof. Further, when utilized as a communicating machine, a communication similar to that of the portable telephone of the background art can be carried out by detaching the communicating machine from the wrist and by a speaker and a microphone included at an inner side portion of a strap. However, in comparison with the portable telephone of the background art, the communicating machine is remarkably small-sized and light-weighted.

Next, a constitution of the portable information apparatus 110 of the embodiment will be explained. As shown by FIG. 14, the portable information apparatus 110 includes the piezoelectric vibrator 1, and a power source portion 111 for supplying a power. The power source portion 111 includes, for example, a lithium secondary cell. The power source portion 111 is connected in parallel with a control portion 112 for carrying out various controls, a time counting portion 113 of counting time or the like, a communicating portion 114 for carrying out a communication with outside, a display portion 115 for displaying various information, and a voltage detecting portion 116 of detecting voltages of respective function portions. Further, the power is supplied to the respective function portions by the power source portion 111.

The control portion 112 controls an operation of a total of a system of receiving and transmitting voice data, measuring and displaying current time or the like. Further, the control portion 112 includes ROM previously written with programs, CPU of reading and executing programs written to the ROM, a RAM used as a work area of the CPU and the like.

The time counting portion 113 includes an integrated circuit including an oscillating circuit, a register circuit, a counter circuit and an interface circuit and the like, and the piezoelectric vibrator 1. When a voltage is applied to the piezoelectric vibrator 1, the piezoelectric vibrating piece 2 is vibrated, the vibration is converted into an electric signal by a piezoelectric property provided to quartz and is inputted to an oscillating circuit as an electric signal. An output of the oscillating circuit is binarized and is counted by the register circuit and the counter circuit. Further, a signal is transmitted to and received from the control portion 112 by way of the interface circuit, and the display portion 115 is displayed with current time or current date or calendar information or the like.

The communicating portion 114 is provided with a function similar to that of the portable telephone of the background art and includes a wireless portion 117, a voice processing portion 118, a switching portion 119, an amplifying portion 120, a voice inputting and outputting portion 121, a telephone number inputting portion 122, an arrival sound generating portion 123, and a call control memory portion 124.

The wireless portion 117 exchanges to transmit and receive various data of voice data or the like to and from a base station by way of an antenna 125. The voice processing portion 118 codes and decodes a voice signal inputted from the wireless portion 117 or the amplifying portion 120. The amplifying portion 120 amplifies a signal inputted from the voice processing portion 118 or the voice inputting and outputting portion 121 to a predetermined level. The voice inputting and outputting portion 121 includes a speaker, a microphone and the like for making an arrival sound or received voice loud, or collecting voice.

Further, the arrival sound generating portion 123 generates arrival sound in accordance with call from a base station. The switching portion 119 switches the amplifying portion 120 connected to the voice processing portion 118 to the arrival sound generating portion 123 only in arrival of signal, thereby, arrival sound generated at the arrival sound generating portion 123 is outputted to the voice inputting and outputting portion 121 by way of the amplifying portion 120.

Further, the call control memory portion 124 stores a program related to a call control of transmission and arrival of communication. Further, the telephone number inputting portion 122 includes, for example, number keys of 0 through 9 and other key, and a telephone number of a speech destination or the like is inputted by depressing the number keys and the like.

When the voltages applied to the respective function portions of the control portion 112 and the like by the power source portion 111 become lower than a predetermined value, the voltage detecting portion 116 detects the voltage drop to inform to the control portion 112. The predetermined voltage value at this occasion is a value previously set as a minimum voltage necessary for stably operating the communicating portion 114 and is, for example, about 3V. The control portion 112 informed of the voltage drop of the voltage detecting portion 116 prohibits operations of the wireless portion 117, the voice processing portion 118, the switching portion 119 and the arrival sound generating portion 123. Particularly, it is indispensable to stop the operation of the wireless portion 117 having a large power consumption. Further, a statement that the communicating portion 114 cannot be used by a deficiency in a remaining amount of the battery is displayed on the display portion 115.

That is, the operation of the communicating portion 114 can be prohibited and the statement can be displayed on the display portion 115 by the voltage detecting portion 116 and the control portion 112. Although the display may be a character message, x (check) mark may be attached to a telephone icon displayed at an upper portion of a display face of the display portion 115 as a further intuitive display.

Further, by providing the power source cutting portion 126 capable of selectively cutting the power source of the portion related to the function of the communicating portion 114, the function of the communicating portion 114 can further firmly be stopped.

According to the portable information apparatus 110 of the embodiment, the piezoelectric vibrator 1 brought into high quality formation and low cost formation is provided, and therefore, also the portable information apparatus per se can achieve high quality formation and can achieve low cost formation by promoting a reliability of the operation similarly. Further, in addition thereto, highly accurate timepiece information which is stable over a long period of time can be displayed.

Next, an embodiment of a radiowave timepiece according to the invention will be explained in reference to FIG. 15.

Figure 15:
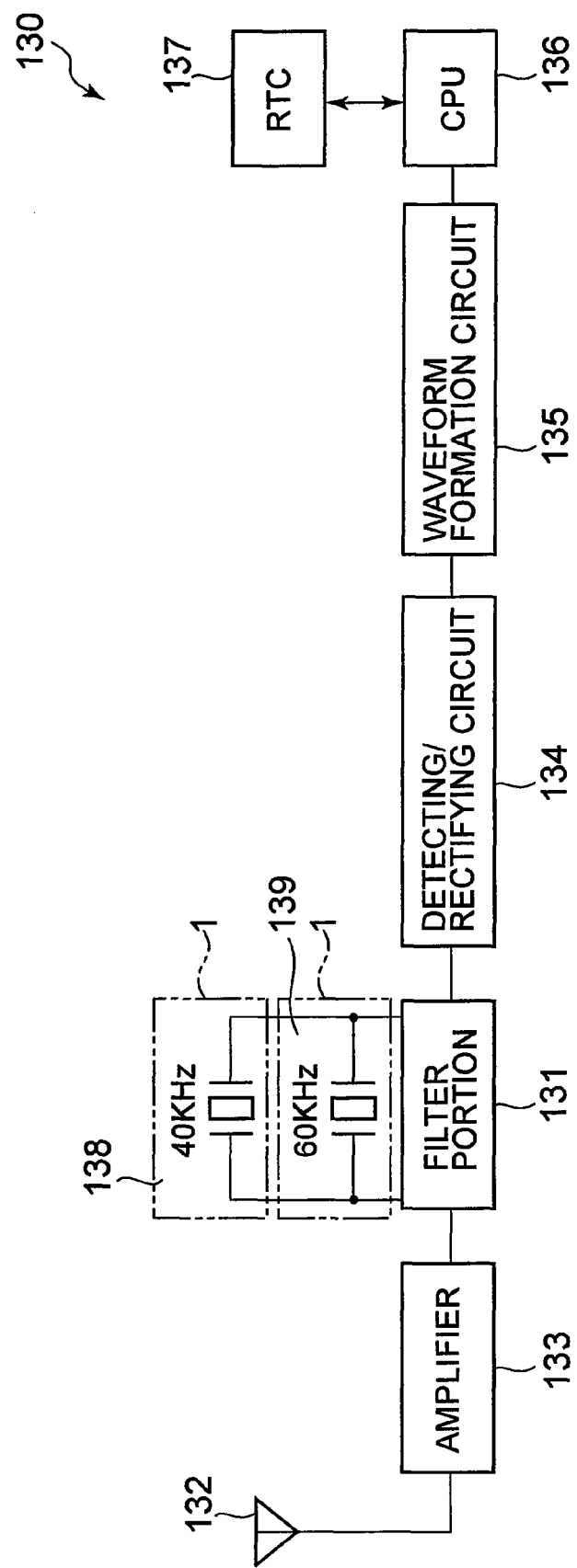
FIG. 15 is a constitution view showing an embodiment of a radiowave timepiece according to the invention.

As shown by FIG. 15, a radiowave timepiece 130 of the embodiment includes the piezoelectric vibrator 1 electrically connected to a filter portion 131, and is a timepiece having a function of automatically correcting time to accurate time to display by receiving a standard radiowave including time information.

In Japan, there are transmission places (transmission stations) of transmitting the standard radiowave at Fukushima prefecture (40 kHz) and Saga prefecture (60 kHz), respectively transmitting the standard radiowave. A long wave of 40 kHz or 60 kHz is provided with both of a property of propagating on the ground surface and propagating while being reflected by the ionosphere and the ground surface, and therefore, a propagating range is wide, and all of Japan is covered by the two transmitting places.

A function constitution of the radiowave timepiece 130 will be explained in details.

An antenna 132 receives the standard radiowave of the long wave of 40 kHz or 60 kHz. The standard radiowave of the long wave subjects time information referred to as time code to AM modulation to a carrier wave of 40 kHz or 60 kHz. The received standard radiowave of the long wave is amplified by an amplifier 133, filtered and tuned by the filter portion 131 having a plurality of the piezoelectric vibrators 1. The piezoelectric vibrators 1 according to the embodiment respectively include quartz vibrator portions 138, 139 having resonance frequencies of 40 kHz and 60 kHz the same as the carrier frequency.

Further, the filtered signal of the predetermined frequency is detected and decoded by a detecting, rectifying circuit 134.

Successively, the time code is taken out by way of a waveform shaping circuit 135, and counted by CPU 136. CPU 136 reads information of current year, accumulated date, day of week, time or the like. The read information is reflected to RTC 137 and accurate time information is displayed.

The carrier wave is provided with 40 kHz or 60 kHz, and therefore, the vibrators having the above-described structure of the tuning fork type are preferable for the quartz vibrator portions 138, 139.

Further, although the above-described explanation has been shown by the example of Japan, the frequency of the standard radiowave of long wave differs overseas. For example, in Germany, a standard radiowave of 77.5 kHz is used. Therefore, when the radiowave timepiece 130 capable of dealing with overseas is integrated to a portable apparatus, the piezoelectric vibrator 1 of a frequency which differs from that of the case of Japan is further needed.

According to the radiowave timepiece 130 of the embodiment, the piezoelectric vibrator 1 brought into high quality formation and low cost formation is provided, and therefore, also the radiowave timepiece per se can achieve high quality formation and can achieve low cost formation by promoting a reliability of the operation similarly. Further, in addition thereto, time can be counted stably and highly accurately over a long period of time.

Further, the technical range of the invention is not limited to the above-described embodiment but can variously be modified within the range not deviated from the gist of the invention.

For example, although according to the above-described embodiment, an example is taken by the case of forming 4 of the through holes 40 at the wafer S, the embodiment is not limited to 4 but may be 2 or more.

Further, although when the wafer S is viewed planely, the through hole 40 is formed in a circular shape, the invention is not limited to the case but a polygonal shape of a quadrangular shape or the like will do. However, it is preferable to form the through hole to constitute a corner portion of intersecting a straight line and a straight line by R shape (smooth curve). Thereby, a crack is difficult to be brought about at the wafer S by constituting an onset by the corner portion. Therefore, a chip off or a crack or the like can be prevented from being brought about at the wafer S. Further, it is preferable to form the through hole 40 in a circular shape as in the above-described embodiment.

Figure 16A:
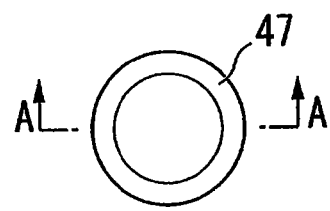
FIGS. 16A and 16B are views showing a modified example of an inserting pin of a jig for a wafer according to the invention.
Figure 16B:
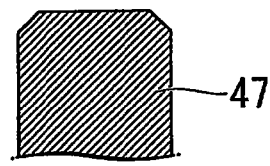
Figure 17A:
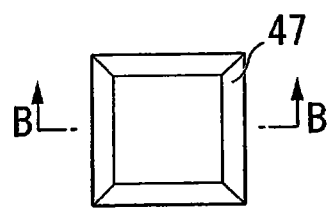
FIGS. 17A and 17B are views showing a modified example of an inserting pin of a jig for a wafer according to the invention.
Figure 17B:
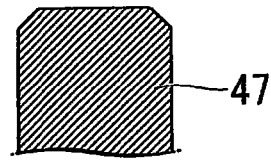
Figure 18A:
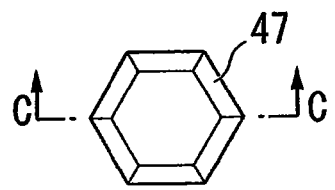
FIGS. 18A and 18B are views showing a modified example of an inserting pin of a jig for a wafer according to the invention.
Figure 18B:
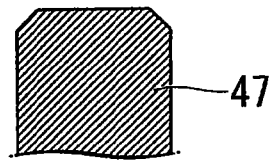

Further, although the front end of the inserting pin 47 is constituted by the converging shape by forming in the taper shape, as shown by FIGS. 16A and 16B, the converging shape may be constituted by carrying out C face chamfering. Further, although according to the above-described embodiment, the inserting pin 47 is constituted by the circular pillar shape, the invention is not limited to the case but as shown by FIGS. 17A and 17B and FIGS. 18A and 18B, the inserting pin 47 may be formed by a polygonal shape of a quadrangular shape or a hexagonal shape or the like. However, it is preferable to constitute the shape of the circular pillar an outer peripheral face of which is smooth.

What is claimed is:

1. A method of fabricating a plurality of piezoelectric vibrating pieces each including a piezoelectric plate made of a piezoelectric material, and an electrode formed on an outer surface of the piezoelectric plate for vibrating the piezoelectric plate when a predetermined voltage is applied thereto at a time utilizing a wafer, the method comprising:

an outer shape forming step of forming two or more of through holes penetrating the wafer and forming outer shapes of the plurality of piezoelectric plates at the wafer by constituting reference points by centers of the through holes by etching the wafer by a photolithography technology;

a wafer setting step of preparing a jig for the wafer having a flat plate portion and inserting pins formed by a number the same as a number of the through holes to project from above the flat plate portion, thereafter, mounting the wafer on the flat plate portion in a state of inserting the inserting pins into the through holes;

an electrode forming step of forming an electrode by patterning the electrode film on the outer surfaces of the plurality of piezoelectric plates; and a cutting step of cutting to separate the plurality of piezoelectric plates on the wafer to fragment;

wherein in the electrode forming step and the cutting step, positioning to the wafer is carried out by constituting at least one of the reference points by the center of the through hole.

2. The method of fabricating a piezoelectric vibrating piece according to claim 1, wherein in the outer shape forming step, the through hole is formed such that a corner portion thereof is constituted by a smooth curve when the wafer is viewed planely.

3. The method of fabricating a piezoelectric vibrating piece according to claim 1, wherein in the outer shape forming step, the through hole is formed to constitute a circular shape when the wafer is viewed planely.

* * * * *